(12) United States Patent
Kroneder et al.

(10) Patent No.: US 8,264,071 B2
(45) Date of Patent: Sep. 11, 2012

(54) POWER SEMICONDUCTOR MODULE WITH OVERCURRENT PROTECTIVE DEVICE

(75) Inventors: Christian Kroneder, Schwanstetten (DE); Uwe Scheuermann, Nürnberg (DE); Dejan Schreiber, Nürnberg (DE)

(73) Assignee: Semikron Elektronik GmbH & Co. KG, Nürenberg (DE)

( * ) Notice: Subject to any disclaimer, the term of this patent is extended or adjusted under 35 U.S.C. 154(b) by 0 days.

(21) Appl. No.: 11/527,936

(22) Filed: Sep. 27, 2006

(65) Prior Publication Data

US 2007/0085181 A1    Apr. 19, 2007

(30) Foreign Application Priority Data

Sep. 27, 2005   (DE) .................... 10 2005 046 063

(51) Int. Cl.
*H01L 23/62* (2006.01)
(52) U.S. Cl. ...................................... 257/665
(58) Field of Classification Search .......... 257/E23.006, 257/665; 337/297, 276
See application file for complete search history.

(56) References Cited

U.S. PATENT DOCUMENTS

| | | | |
|---|---|---|---|
| 4,862,134 A * | 8/1989 | Poerschke et al. ............ 337/231 |
| 5,015,675 A | 5/1991 | Walles et al. | |
| 5,130,689 A * | 7/1992 | Raykhtsaum et al. ........ 337/296 |
| 5,744,860 A | 4/1998 | Bayerer | |
| 5,858,454 A * | 1/1999 | Kiryu et al. .................... 427/118 |
| 6,005,470 A * | 12/1999 | Smith et al. .................... 337/273 |
| 6,424,035 B1 | 7/2002 | Sapp et al. | |
| 2004/0245548 A1 * | 12/2004 | Stockmeier et al. .......... 257/202 |

FOREIGN PATENT DOCUMENTS

| JP | 3214657 | 9/1991 |
|---|---|---|
| WO | WO 03/069968 | 8/2003 |

* cited by examiner

*Primary Examiner* — Bradley K Smith
(74) *Attorney, Agent, or Firm* — The Law Offices of Roger S. Thompson

(57) ABSTRACT

A power semiconductor module having at least one fuse. The power semiconductor module comprises a housing, load terminal elements that lead outside of the housing, and a substrate disposed inside the housing with a plurality of metal connecting tracks of different polarity electrically insulated from one another. On at least one of these connecting tracks, at least one power semiconductor component is disposed and is connected correctly in terms of circuitry to first connecting elements that have a first line cross section. The fuse comprises a second connecting element that has a second line cross section, less than the first, and is disposed between two connecting tracks and/or between a connecting track and a load terminal element. The second connecting element is sheathed in one portion by an explosion protection means.

9 Claims, 2 Drawing Sheets

POWER SEMICONDUCTOR MODULE WITH OVERCURRENT PROTECTIVE DEVICE

BACKGROUND OF THE INVENTION

1. Field of the Invention

The invention is directed to the field of power semiconductor modules and, more particularly, to power semiconductor modules having at least one fuse.

2. Description of the Related Art

Power semiconductor modules that are the point of departure for this invention are known for instance from German Patent Disclosure DE 103 16 355 B3. This reference discloses a power semiconductor module in the form of a half-bridge circuit arrangement, having a first and a second power switch. Each of these power switches is embodied as a parallel circuit of power transistors, each with an associated free-wheel diode. One first and one second power transistor with respective associated power diodes are each disposed on their own substrate.

In the above-referenced German Patent Disclosure, the substrates of the power semiconductor modules are embodied as insulating substrates, having an insulating body as substrate material and for electrical insulation relative to a base plate or a heat sink. These insulating bodies in the referenced disclosure are made up of an industrial ceramic, such as aluminum oxide or aluminum nitrite. A plurality of metal connecting tracks electrically insulated from one another are located on the insulating body, on its first main face oriented toward the interior of the power semiconductor module. The power semiconductor components are located on the tracks.

Usually, on its second main face remote from the interior of the power semiconductor module, the insulating body also has a metal layer of the same material and of the same thickness as that of the connecting tracks on the first main face. As a rule, however, this layer is not intrinsically structured, since it serves the purpose for instance of the soldered connection with a base plate. Both the connecting tracks and the metal layer of the second main face preferably comprise copper applied by the DCB (Direct Copper Bonding) method, and the copper then has a typical thickness of less than 1 mm.

The aforementioned power semiconductor modules of the prior art furthermore have load terminal elements for the two direct current terminals and for the at least one alternating current terminal. The load terminal elements connect external contacting means to associated connecting tracks on the substrate.

For internal insulation, power semiconductor modules in the prior art are potted to a level above the connecting elements with a potting compound having a high dielectric constant.

Modern power semiconductor components, especially power transistors, in the course of technological progress have an increasingly large current density. The power semiconductor components and the connecting tracks are typically connected by bond connections and in this case especially wire bond connections. In the prior art, various error scenarios in the use of power semiconductor modules are detected by suitable sensors in the power semiconductor module or in the circuitry of the power semiconductor module, and provisions to counter the errors, such as shutting off the power switches, are initiated by appropriate triggering electronics. However, error scenarios also occur that are not, or not completely, detected by this means. In those cases, an overcurrent may briefly flow and overload the bond wires within the interior of the power semiconductor module. This overcurrent melts at least one bond wire and, because of the existing inductances, the current flow arcs over the melted wire. In power semiconductor modules with a potting compound, this often leads to an explosion of the power semiconductor module due to the lack of compressibility of this potting compound in the short time interval and because of the internal pressure that thus builds up rapidly.

SUMMARY OF THE INVENTION

The object of the invention is to refine a power semiconductor module with a protective device, disposed in the interior of the power semiconductor module, in order to prevent explosive destruction of the power semiconductor module from excessively high currents.

The protective device protecting against excessive currents in the interior of the power semiconductor module will hereinafter be called a fuse, for the sake of simplicity.

The invention describes a power semiconductor module which comprises a housing, preferably with a base plate for mounting on a heat sink, and at least one electrically insulating substrate located within the housing. The substrate in turn comprises an insulating body with a plurality of metal connecting tracks located therein, the connecting tracks being insulated from one another and further comprising power semiconductor components, located on the connecting tracks and connected to these connecting tracks correctly in terms of circuitry. The power semiconductor module furthermore has terminal elements for extreme load contacts and auxiliary contacts. The module also has connecting elements for connections in the interior of the power semiconductor module.

The inventive concept is based on a power semiconductor module, preferably having a base plate for mounting on a heat sink. This power semiconductor module has at least the following components: a housing, terminal elements for load terminals and auxiliary terminals, at least one substrate with connecting tracks, and at least one power semiconductor component.

The terminal elements for load terminals lead out of the housing and electrically connect the power semiconductor components disposed in the housing interior. The substrate, embodied as electrically insulating relative to the base plate or a heat sink, in turn comprises an insulating body, preferably an industrial ceramic, and on it, located on its first main face remote from the base plate or the heat sink, a plurality of metal connecting tracks electrically insulated from one another. Power semiconductor components are disposed on these connecting tracks and are connected correctly in terms of circuitry by means of first connecting elements that have a first line cross section. Preferably, these first connecting elements are designed as bond connections, having a plurality of individual bond wires. A bond connection of this kind has a first line cross section, which is made up of the total of the cross-sectional areas of all the bond wires of the bond connection.

In its interior, the power semiconductor module has at least one fuse, and this fuse comprises a second connecting element with a second line cross section that is less than the first. The fuse is disposed between two connecting tracks and/or between one connecting track and one load terminal element. This second connecting element is moreover completely sheathed in one portion by an explosion protection means. This explosion protection means allows a controlled development of an arc, without leading to a very rapid pressure increase in this explosion protection means that may result in an explosion.

Other objects and features of the present invention will become apparent from the following detailed description considered in conjunction with the accompanying drawings.

It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings.

The invention will be described in further detail in conjunction with FIGS. 1 through 3.

DETAILED DESCRIPTION OF THE PRESENTLY PREFERRED EMBODIMENTS

Figure 1:
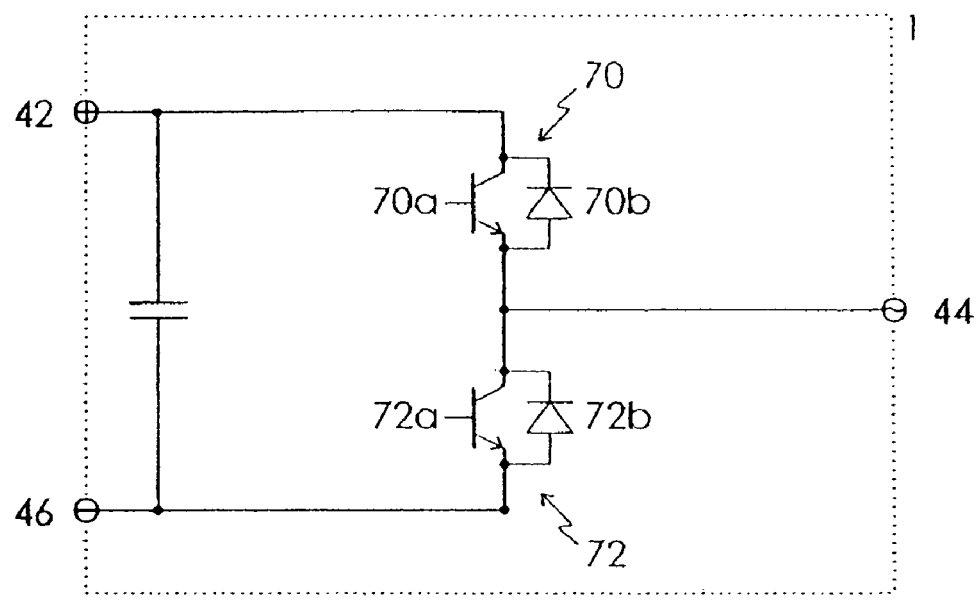
FIG. 1 shows a circuit topology of a power semiconductor module of the prior art.

FIG. 1 shows a circuit topology of a power semiconductor module 1 of the prior art. FIG. 1 shows a half-bridge circuit, of the kind that is a fundamental component of many known power electronic circuit topologies. A first, upper, power switch 70 is connected in series with a second, lower, power switch 72. First power switch 70 is connected to a positive terminal 42 of an intermediate direct current circuit. Second power switch 72 is connected to a negative terminal 46 of the intermediate direct current circuit. The center pickup of the circuit forms an alternating current output 44 of the half-bridge circuit.

Power switches 70, 72 are embodied as an arrangement of at least one power transistor 70a, 72a and at least one power diode 70b, 72b, connected antiparallel to the power transistor or power transistors 70a, 72a, respectively.

Figure 2:
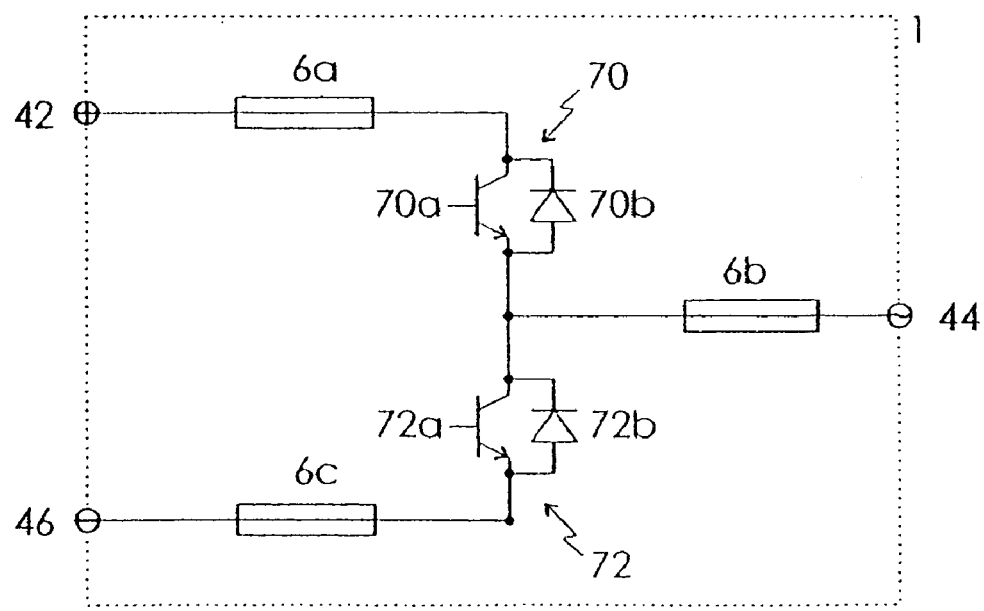
FIG. 2 shows a circuit topology of a power semiconductor module of the invention.

FIG. 2 shows a circuit topology of a power semiconductor module 1 of the invention. The circuit topology shown is likewise a half-bridge circuit. However, the concept of the invention can be employed in any other circuit topology as well. According to the invention, the power semiconductor module 1 based on this circuit is refined by incorporating at least one, and in this case three, fuses 6a/b/c into the circuit.

One advantageous feature here is the disposition of one fuse 6b between the center pickup and the alternating current terminal 44.

A further advantageous feature disposes one fuse 6a, 6c each between the respective direct current terminal 42, 46 and the associated power switch 70, 72.

The disposition of three fuses 6a/b/c inside one power semiconductor module 1 is the most complicated, but at the same time safest, embodiment of the invention. Disposing only one fuse 6a/b/c cannot protect against all possible failure scenarios but does make an appropriate compromise between expense and utility.

Figure 3:
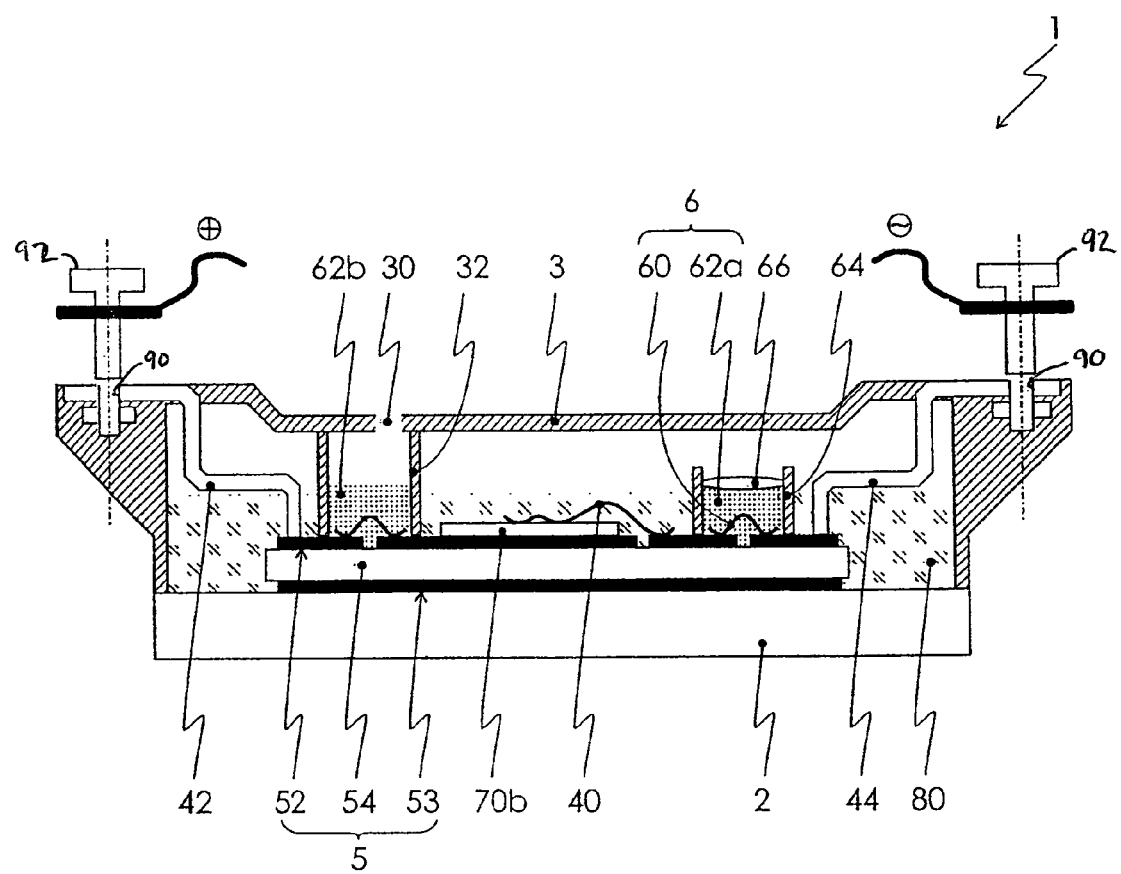
FIG. 3 shows an embodiment of a power semiconductor module of the invention.

FIG. 3 shows an embodiment of a power semiconductor module 1 of the invention. It has a base plate 2, on which both a housing 3 and a substrate 5 are disposed. Substrate 5 comprises an insulating body 54 as well as metal linings 52, 53, which are disposed on both main faces. The metal lining 53 facing toward the base plate 2 is embodied two-dimensionally and is not intrinsically structured. By means of a soldered connection between this lining 53 and base plate 2, these two elements are fixed to one another. By comparison, metal lining 52 oriented toward the interior of the power semiconductor module is intrinsically structured and thus embodies the connecting tracks of substrate 5.

The terminal elements, shown here as a direct current terminal 42 of positive polarity and an alternating current terminal 44, are formed by molded metal bodies, which are joined by soldering one end thereof to the associated connecting track 52. On their other end, each has a recess 90 for receiving a screw 92 therein.

Power semiconductor components 70, 72, shown here as a power diode 70b, are disposed on these connecting tracks 52. Electrical terminal elements form power terminals 42, 44 and the auxiliary terminals, not explicitly shown. In accordance with the circuit topology in FIG. 2, the connection appropriately in terms of circuitry of the power semiconductor components 70, 72 (in this case the power diode 70b), to the connecting tracks 52 is embodied as a bond connection 40. This bond connection has for example ten individual bond wires, each with a diameter of approximately 300 µm, resulting in a first line cross section of the connection with this power semiconductor component of approximately 0.71 mm$^2$.

Also shown are two embodiments of a fuse 6 of the invention of power semiconductor module 1. The first embodiment has a bond connection 60 between conductor track 52 of the positive terminal 42 and conductor track 52 of the power diode 70b, which is disposed thereon on the cathode side. This bond connection 60 is embodied by means of five bond wires, each with a diameter of approximately 300 µm. The result is accordingly a second line cross section, which amounts to 50% of the first line cross section. It is especially advantageous if this second line cross section amounts to between 40% and 60% of the first line cross section. This markedly smaller second line cross section is sufficient, since if the current flows only briefly, or in other words is a so-called overload current, then the only determining variable is the line cross section. In comparison, the embodiment of the bond connections with the power semiconductor components is determined by further variables, such as the current distribution on the power semiconductor component. These connections are therefore typically embodied with a markedly larger line cross section than would be necessary for the carrying capacity for an overload current.

The bond wires that form this second connecting element 60 are surrounded, except for their respective contact face with the associated conductor track 52, by silicon oxide 62 as an explosion protection means. This silicon dioxide 62 advantageously has a particle size of between about 50 µm and about 2 mm. The silicon oxide is present here as either a substantially pure material 62a or as a mixture of material 62b with a minimum concentration of silicon oxide of about 90%.

It is especially preferred that a binder be added to silicon oxide 62b. As a result, covering silicon oxide 62b is not absolutely necessary, since in bound form it surrounds bond wires 60 and is thus fixed in its position in the power semiconductor module 1.

Bond wires 60 with explosion protection means 62 are surrounded by a framelike arrangement 32, which is embodied here as a housing part 3 and is disposed on substrate 5 by means of an adhesive bond. Contact between explosion protection means 62 and the potting compound, preferably a silicone rubber 60, is thus prevented. Housing 3 furthermore, on its top side, has a suitable opening 30 for filling the power semiconductor module with explosion protection means 62.

The second embodiment shown has a framelike delimiting device 64, preferably comprising a plastic material, which is joined adhesively to substrate 5. In the interior of delimiting device 64, the bond connection and the explosion protection means 60 are disposed. If the latter has no binder added, a closure means 66, such as an epoxy resin, is provided for fixing the explosion protection means 60a in the intended position.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module having at least one fuse, wherein the power semiconductor module comprises:
    a housing;
    outward-extending load terminal elements; and
    at least one electrically insulating substrate disposed inside said housing, said at least one electrically insulating substrate having
        an insulating body with at least a first main face oriented toward the power semiconductor module; and
        at least first and second connecting tracks of different polarity, electrically insulated from one another, located on said first main face, for receiving at least one power semiconductor component; and first connecting elements with a first line cross section to connect said power semiconductor component;
    wherein said fuse comprises a second connecting element having a second line cross section less than said first line cross section, located between said first connecting track and one of said second connecting track and a load terminal element; and
    wherein said second connecting element is at least partly sheathed by an explosion protection means, and said second connecting element and said explosion protecting means are enclosed in a frame, said explosion protecting means allowing for the controlled development of an arc, thereby avoiding a rapid increase in pressure due to an explosion.

2. The power semiconductor module as defined by claim 1, wherein at least one of said first connecting element and said second connecting element is embodied as a respective bond connection, having a plurality of individual substantially identical bond wires.

3. The power semiconductor module as defined by claim 1, wherein said frame includes a closure device positioned on the side thereof remote from said substrate and above the explosion protection means.

4. The power semiconductor module as defined by claim 1, wherein said frame is joined to said substrate by means of an adhesive bond.

5. The power semiconductor module as defined by claim 1, wherein said housing has an opening in the vicinity of said frame.

6. The power semiconductor module as defined by claim 1, wherein said explosion protection means, comprises silicon dioxide with a particle size of between about 50 µm and about 2 mm to an extent of more than about 90%.

7. The power semiconductor module as defined by claim 6, wherein said explosion protection means includes a binder.

8. The power semiconductor module as defined by claim 1, wherein said second line cross section of said second connecting element is approximately between about 40% and about 60% of said first line cross section of said first connecting element.

9. The power semiconductor module as defined by claim 1, wherein the power semiconductor module embodies a half-bridge circuit, and the fuse is disposed between at least one load terminal of said half bridge circuit and a power semiconductor component.

* * * * *